United States Patent
Fetzer et al.

(10) Patent No.: US 10,084,323 B2
(45) Date of Patent: Sep. 25, 2018

(54) METHOD FOR BATTERY MODULE BALANCING AND BATTERY MANAGEMENT SYSTEM

(71) Applicants: Robert Bosch GmbH, Stuttgart (DE); Samsung SDI Co., Ltd., Yongin-si, Gyeonggi-do (KR)

(72) Inventors: Joachim Fetzer, Bad-Ditzenbach (DE); Hans-Joerg Wolff, Schorndorf (DE); Hans Partes, Asperg (DE); Stefan Butzmann, Schalksmühle (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 132 days.

(21) Appl. No.: 14/650,320

(22) PCT Filed: Nov. 26, 2013

(86) PCT No.: PCT/EP2013/074668
§ 371 (c)(1),
(2) Date: Aug. 11, 2015

(87) PCT Pub. No.: WO2014/090560
PCT Pub. Date: Jun. 19, 2014

(65) Prior Publication Data
US 2015/0364935 A1    Dec. 17, 2015

(30) Foreign Application Priority Data
Dec. 11, 2012    (DE) .................. 10 2012 222 746

(51) Int. Cl.
*H02J 7/00*    (2006.01)
*B60L 11/18*    (2006.01)
(Continued)

(52) U.S. Cl.
CPC ......... *H02J 7/0016* (2013.01); *B60L 11/1853* (2013.01); *B60L 11/1864* (2013.01);
(Continued)

(58) Field of Classification Search
CPC ............. B60L 11/1853; B60L 11/1866; G01R 19/16542; H01M 10/441; H01M 10/482; H01M 2220/20
See application file for complete search history.

(56) References Cited

U.S. PATENT DOCUMENTS

| 5,670,861 A | 9/1997 | Nor |
| 5,886,503 A * | 3/1999 | McAndrews ...... G01R 31/3658 320/121 |

(Continued)

FOREIGN PATENT DOCUMENTS

| DE | 10 2010 027 869 A1 | 10/2011 |
| DE | 10 2010 027 864 A1 | 12/2011 |

(Continued)

OTHER PUBLICATIONS

International Search Report corresponding to PCT Application No. PCT/EP2013/074668, dated Nov. 3, 2014 (German and English language document) (6 pages).

*Primary Examiner* — Muhammad S Islam
(74) *Attorney, Agent, or Firm* — Maginot, Moore & Beck LLP (57) ABSTRACT

The disclosure relates to a method for battery module balancing of a battery, which comprises at least one battery module string, wherein the at least one battery module string has a plurality of battery modules connected in series or parallel, wherein each battery module has a single or a plurality of battery cells connected in parallel or in series and a coupling unit which is designed to switch on and off the battery module, said method comprising the steps of: determining a battery module state of at least two battery mod- (Continued)

ules; switching off individual battery modules having a low battery module state, wherein the low state is defined by a defined ratio to an initial state of the battery modules or by a result of a comparison of all detected battery module states.

4 Claims, 5 Drawing Sheets (51) Int. Cl.
*H01M 10/42* (2006.01)
*H01M 10/44* (2006.01)
*H01M 10/48* (2006.01)
*G01R 31/36* (2006.01)
*G01R 19/165* (2006.01)

(52) U.S. Cl.
CPC ....... *B60L 11/1866* (2013.01); *H01M 10/425* (2013.01); *H01M 10/441* (2013.01); *H01M 10/482* (2013.01); *H02J 7/0021* (2013.01); *G01R 19/16542* (2013.01); *G01R 31/3606* (2013.01); *H01M 2010/4271* (2013.01); *H01M 2220/20* (2013.01); *Y02T 10/7005* (2013.01); *Y02T 10/7061* (2013.01)

(56) References Cited

U.S. PATENT DOCUMENTS

| 2004/0135546 A1* | 7/2004 | Chertok | B60L 11/185 |
| | | | 320/118 |
| 2008/0048617 A1* | 2/2008 | Yoshida | B60L 11/1861 |
| | | | 320/132 |
| 2008/0143292 A1* | 6/2008 | Ward | B60L 8/003 |
| | | | 320/101 |
| 2008/0211459 A1* | 9/2008 | Choi | B60L 3/0046 |
| | | | 320/134 |
| 2009/0267566 A1* | 10/2009 | Yano | B60L 11/1861 |
| | | | 320/118 |
| 2010/0134068 A1* | 6/2010 | Lim | H02J 7/0016 |
| | | | 320/116 |
| 2012/0013304 A1 | 1/2012 | Murase et al. | |
| 2012/0268070 A1* | 10/2012 | Park | H01M 10/441 |
| | | | 320/126 |

FOREIGN PATENT DOCUMENTS

| DE | 10 2010 060 305 A1 | 5/2012 |
| DE | 10 2011 002 548 A1 | 7/2012 |
| WO | 2010/088944 A2 | 8/2010 |

\* cited by examiner

METHOD FOR BATTERY MODULE BALANCING AND BATTERY MANAGEMENT SYSTEM

This application is a 35 U.S.C. § 371 National Stage Application of PCT/EP2013/074668, filed on Nov. 26, 2013, which claims the benefit of priority to Serial No. DE 10 2012 222 746.6, filed on Dec. 11, 2012 in Germany, the disclosures of which are incorporated herein by reference in their entirety.

BACKGROUND

The present disclosure relates to a method for battery module balancing and to a battery management system.

The subject matter of the disclosure is also a motor vehicle which is provided with such a battery management system.

The trend is that, in the future, new battery systems will increasingly be used both in stationary applications, for example in wind turbines, and in vehicles, for example in hybrid and electric vehicles.

Although the production of the battery cells is standardized, fluctuations in the electronic properties, for example the voltage provided, the battery capacity and the internal complex impedance, can be observed. Owing to different aging processes, the differences in the electronic properties of the battery cells are further intensified.

WO 2010/088944 A2 discloses an energy storage arrangement comprising a plurality of battery cells connected in series and having a power output and a control unit, in which at least some of the cells connected in series are connected to the power output and the control unit via converter and control units which are in each case connected in parallel and are regulated with a floating potential in such a way that each of the cells is operated during the charging, discharging and charge reversal processes corresponding to the individual performance features of this cell by means of targeted current withdrawals by the converter and control units. Different types of cells are thus connected with one another to form an energy storage arrangement in order to achieve an extension of the total use duration.

SUMMARY

In the method according to the disclosure for battery module balancing, it is provided that a battery module state of at least two battery modules is determined, and individual battery modules with a low battery module state are disconnected, wherein the low battery module state is defined
  i) by a defined ratio with respect to an initial state of the battery modules or
  ii) by a result of a comparison of all of the detected battery module states with one another.

Preferably, the battery module states of all of the battery modules are detected. In the battery system according to the disclosure, the individual battery cells are not connected to one another by a simple series circuit as in the case of conventional traction batteries. The battery system according to the disclosure comprises at least one battery module string, which comprises a plurality of battery modules connected in series or in parallel, wherein, in turn, each battery module comprises a single or a plurality of battery cells connected in parallel or in series and a coupling unit, which is designed to connect or disconnect the battery module. In order to connect or disconnect the battery modules, the coupling units are actuated by an assigned control unit.

A particular advantage of the method according to the disclosure consists in that active balancing of the battery modules takes place by prioritization of the use of the individual battery modules. It is particularly advantageous that overloading of weaker battery modules and weaker battery cells is prevented, which extends the life of the battery. The installed battery modules are therefore used sustainably. The prioritization takes place in such a way that the strongest and most efficient battery modules are active the most often during operation and this gives the weakest battery modules a break, which prevents premature aging of the weakest battery modules. Without operation in the priority mode, all of the battery modules would be used at any time for providing the energy for the electric motor, with the result that the weakest battery modules would become impaired the quickest, which would mean that they would need to be replaced soon.

In addition to this, provision can be made for the coupling unit to be designed to connect or disconnect the battery cells assigned to the coupling unit within the battery module individually or jointly. If information on the state of individual battery cells is available to the control unit, this information can be used to only disconnect the weakest battery cells of a battery module. The connection and disconnection of individual battery cells is particularly possible when the number of cells in a battery module is selected to be equal to 1. In addition, cell balancing can take place in a known manner within a module.

In accordance with one embodiment, it is provided that a defined number of weakest battery modules is disconnected. The defined number can be a specific number between 1 and the number of battery modules installed in the battery. For example, provision can be made for only the battery module with the lowest state or the two with the lowest state or for example five with the lowest state to be disconnected. The defined maximum number of battery modules which can be disconnected can be fixed individually for each battery module string.

In accordance with one embodiment, battery modules which are not required for providing a required output voltage are disconnected. The number of battery modules required for providing the output voltage can result from an accelerator pedal position, for example, or can be preset by a further control system, for example.

In accordance with a preferred embodiment, in the case ii), all of the detected battery module states are compared with one another and ordered, i.e. arranged in accordance with a criterion. In this way, the prioritization and balancing over the totality of battery modules and battery module strings are possible.

In accordance with one embodiment, in the case i), a threshold value is provided and a battery module state below the threshold value applies as low battery module state. The threshold value therefore defines the lowest permissible battery state and those battery modules whose value is below the threshold value are disconnected. The threshold value is preferably defined as a percentage in relation to an initial value of the battery module, for example a specific value between 1% and 50%, preferably between 10 and 20%, for example 1%, 5%, 10% or 20%.

Provision can be made for a specific maximum number of disconnectable battery modules to be permitted in each battery module string and for the battery modules only to be disconnected when their state is below the defined threshold value and if the maximum number has not yet been reached.

In accordance with one embodiment of the disclosure, the threshold value is changed, in particular reduced, after a specific time and/or after a specific number of charging/discharging cycles. Advantageously, the battery modules which are weaker at the beginning are thus used again at later points in time if their once low value has exceeded the now even lower threshold value. The threshold value can be reduced, for example, after every fifth or every tenth charging and discharging cycle by a specific percentage value, for example by 1%, 2%, 5% or 10%. Provision can likewise be made for the threshold value to be reduced by a specific percentage value, for example by 1%, 2%, 5% or 10%, after a specific number of days, for example 30 days, 60 days, 90 days or after a specific number of operating hours, for example 10 hours, 20 hours, 50 hours.

In accordance with one embodiment of the disclosure, the battery state is an SOC (state of charge) of the battery. The SOC is measured in a known manner by the battery management system of the vehicle. The SOC is determined, for example, as a function of the open-circuit voltage, i.e. the cell or battery open-circuit voltage, and/or is determined from a current integration and/or a combination of different state variables, such as, for example, the last determined SOC, the cell or battery temperature, the cell or battery open-circuit voltage and the intensity of the cell or battery current.

In accordance with a further embodiment, the battery state is an SOH (state of health), which is a function of two or more parameters selected from the following list: resistance, capacity, SOC, time, charging/discharging cycles and temperature. The end of the battery cell is typically reached when the capacity has been reduced by 20% of the nominal value. The end of life of the battery module can also be defined, for example, by the internal impedance of the battery, however. If the internal impedance increases to a specific value, for example to twice, three times or four times the initial value, it can be concluded that end of life of the battery will be soon. It is difficult to determine the end of life of the battery from the internal impedance value of the battery alone since this value is generally a complex value. The SOH is therefore generally defined as a complex parameter, which comprises lots of information since it is determined by various parameters which determine the life of the battery cell or the battery module.

In accordance with a further aspect of the disclosure, a battery management system for a battery is proposed, said battery having at least one battery module string, which comprises a plurality of battery modules connected in series or in parallel, wherein each battery module in turn comprises a single or a plurality of battery cells connected in parallel or in series and a coupling unit, which is designed to connect or disconnect the battery module, comprising a battery module state detection unit, which is designed to detect a battery module state, and comprising a control unit, which is coupled to the battery module state detection unit and to at least one coupling unit and which is designed to transmit a control signal to the at least one coupling unit on the basis of a determined battery module state in order to connect and disconnect the assigned battery modules.

A further aspect of the disclosure relates to a motor vehicle comprising an electric drive motor for driving the motor vehicle and a battery, which is connected to the electric drive motor and has such a battery management system.

BRIEF DESCRIPTION OF THE DRAWINGS

Exemplary embodiments of the disclosure will be explained in more detail with reference to the drawings and the description below, wherein identical reference symbols denote identical or functionally identical components. In the drawings.

DETAILED DESCRIPTION

Figure 1:
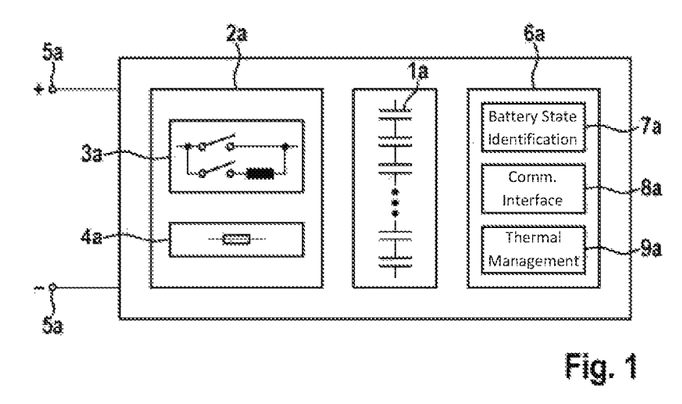
FIG. 1 shows a battery system.

The terms "battery" and "battery system" are used in the present description, in line with conventional usage, for rechargeable batteries or a rechargeable battery system. The basic functional design of a battery system is illustrated in FIG. 1. In order to achieve the required power and energy data used in the battery system, in a battery individual battery cells 1a are connected in series and sometimes additionally in parallel. A safety and fuse unit 2a, which has for example a connection and disconnection unit 3a of the battery to external systems and the fuse 4a of the battery system for impermissibly high currents and voltages, is located between the battery cells 1a and the poles 5a of the battery system. The safety and fuse unit 2a provides safety functions such as, for example, the disconnection of the battery cells 1a at all poles or at a single pole from the battery system poles 5a on opening of the battery system housing. A further functional unit is formed by the battery management 6a, which, in addition to the battery state identification 7a, performs the communication with other systems and control devices via a communications interface 8a and thermal management 9a of the battery.

The functional unit of battery state identification 7a illustrated in FIG. 1 has the task of determining the present state of the battery and predicting the future behavior of the battery, for example a life prediction and/or a range prediction. In a series circuit of battery cells 1a, as illustrated, the performance of the battery is determined by the electronic and chemical properties of the weakest cell, which will therefore suffer most during use. As a consequence of the fluctuations in the electronic and chemical properties of the individual battery cells 1a, a fluctuation in the electrical properties of the battery results.

Figure 2:
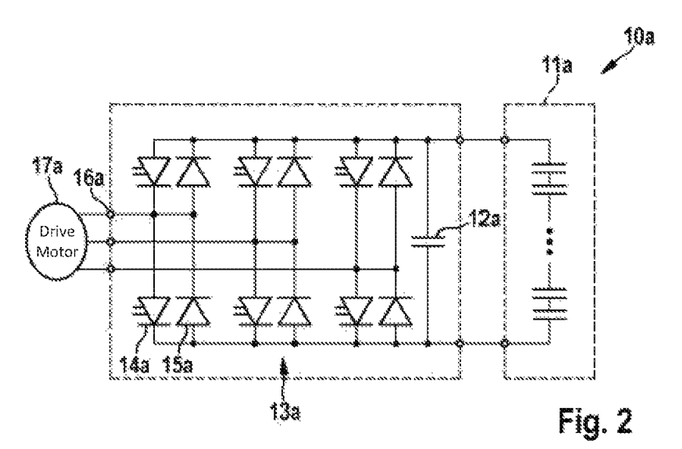
FIG. 2 shows an electric drive system.

FIG. 2 shows a schematic circuit diagram of a conventional electric drive system 10a, as is used, for example, in electric and hybrid vehicles or else in stationary applications such as for rotor blade setting of wind turbines. A battery 11a is connected to a DC link, which is buffered by a capacitor 12a. A pulse-controlled inverter 13a, which provides sinusoidal voltages which are phase-shifted with respect to one another for the operation of an electric drive motor 17a, via in each case two switchable semiconductor valves 14a and two diodes 15a at three outputs 16a. The capacitance of the capacitor 12a is in this case selected to be great enough for the voltage in the DC link to be stabilized for a period of time in which one of the switchable semiconductor valves 14a is connected. In a practical application such as in an electric vehicle, a high capacitance in the mF range results.

Figure 3:
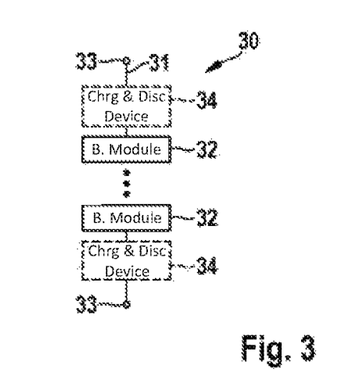
FIG. 3 shows a first embodiment of the battery according to the disclosure.

FIG. 3 shows a first embodiment of the battery 30 according to the disclosure in the form of a battery direct converter (BDC), which has a battery module string 31. The battery module string 31 has a plurality of battery modules 32. In addition, charging and disconnection devices 34 can be provided at the poles 33 of the battery module string 31, for example for the case where safety requirements demand this. However, such disconnection devices 34 are not absolutely necessary because decoupling of the battery modules 32 by coupling units (not illustrated here) contained in the battery modules 32 can take place. The battery 30 is actuated by the travel monitoring unit and the drive train. It is possible for the individual battery module 32 to either be connected or disconnected in the battery module string 31.

Figure 4:
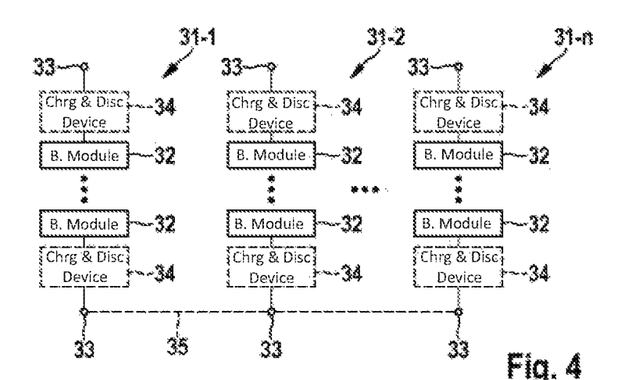
FIG. 4 shows a second embodiment of the battery according to the disclosure.

FIG. 4 shows a second embodiment of the battery 20 according to the disclosure in the form of a battery direct inverter (BDI), which has n battery module strings 31-1 to 31-n. Each battery module string 31-1 to 31-n has a plurality of battery modules 32, wherein preferably each battery module string 31-1 to 31-n contains the same number of battery modules 32 and each battery module 32 contains the same number of battery cells, with identical circuitry. A pole 33 of each battery module string 31-1 to 31-n can be connected to a corresponding pole 33 of the other battery module strings 31-1 to 31-n, which is indicated by a dashed line 35. Charging and disconnection devices 34 can be provided at the poles 33 of the battery module strings 31-1 to 31-n if safety requirements demand this. During operation as a battery direct inverter, virtually sinusoidal voltage profiles can be generated with a phase shift with respect to one another, from which the electric motor can be fed with the required torque. The voltage is preferably such that the alternating current generated provides the necessary torque for operating the electric motor.

Figure 5:
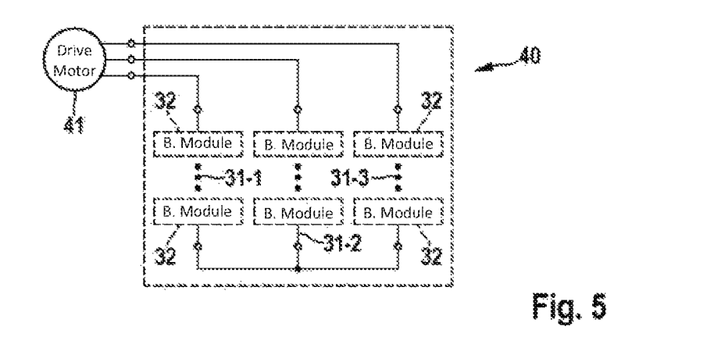
FIG. 5 shows a drive system having an embodiment of the battery according to the disclosure.

FIG. 5 shows a drive system 40, which has an embodiment of the battery according to the disclosure. In the example illustrated, the battery has three battery module strings 31-1, 31-2 and 31-3, which are each connected directly to an input of a drive motor 41. Since most available electric motors are designed for operation with three-phase signals, the battery has precisely three battery module strings. The battery has the advantage that the functionality of a pulse-controlled inverter is already integrated. By virtue of a control unit of the battery activating or deactivating a variable number of battery modules 32 in the battery module strings 31-1, 31-2 or 31-3, there is a voltage available at the output of the battery module string 31-1, 31-2 or 31-3 which is proportional to the number of activated battery modules 32 and which can be between 0 V and the total output voltage of the battery module strings 31-1, 31-2, 31-3.

Figure 6:
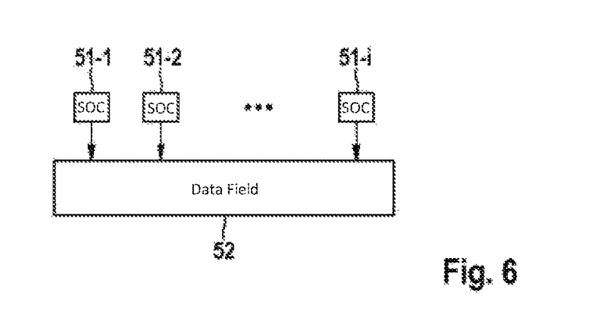
FIG. 6 shows a schematic illustration of a first embodiment of the method according to the disclosure for battery module balancing.

FIG. 6 shows a schematic illustration of the method according to the disclosure in accordance with a first embodiment. In a first step, the battery management system determines the SOC values 51-1, 51-2 to 51-i of battery modules 32-1, 32-2 to 32-i, where i is the number of battery modules in the battery. The SOC values 51-1, 51-2 to 51-i of the battery modules 32-1, 32-2 to 32-i are arranged in increasing order in accordance with their absolute magnitude in a data field 52, in a second step. The possibility of switching off the battery modules is utilized in accordance with the disclosure to switch the weakest battery modules to be inactive, as a result of which the life of the battery modules is extended. If, for example, the battery module 32-2 has been determined as the battery module with the lowest SOC value 51-2, the control unit outputs a signal to the corresponding coupling unit and switches off the battery module 32-2. The number of battery modules to be switched off can be dependent on the voltage required by the drive. In this way, overuse, i.e. overworking of the weakest battery modules, can be prevented. The method is preferably repeated periodically after a defined number of operating hours or days. The previously weaker battery modules are used again at a later point in time since the SOC of the other battery modules decreases during operation. The weaker battery modules can therefore be reused, i.e. connected again, at a later point in time with other stronger battery modules.

Figure 7:
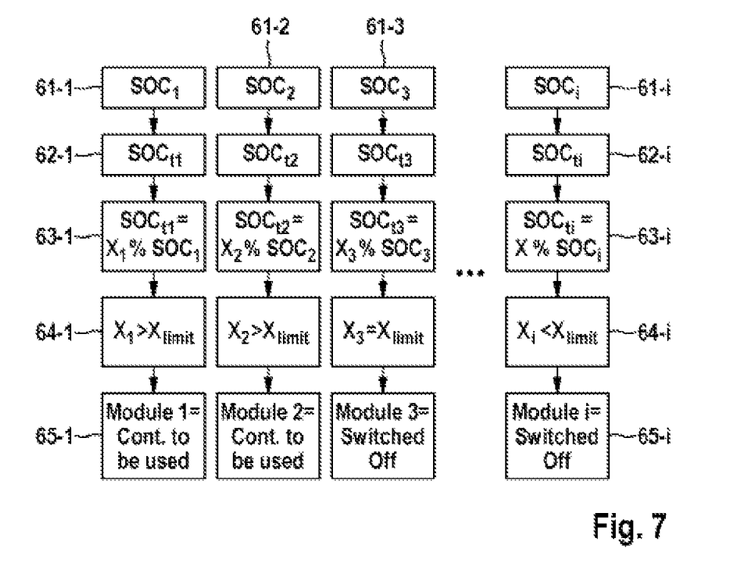
FIG. 7 shows a schematic illustration of a second embodiment of the method according to the disclosure for battery module balancing.

FIG. 7 shows a further possibility of implementing the method according to the disclosure for battery module balancing. In this case too, individual battery modules with a low state are disconnected, wherein a low state is defined in relation to an initial state of the battery modules. For this purpose, an initial value 61-1, 61-2 to 61-i of the SOC of the individual battery modules 32-1, 32-2 to 32-i is determined, where i is the number of battery modules in the battery. At a defined time t, the time value 62-1, 62-2 to 62-i of the SOC value of the individual battery modules 32-1, 32-2 to 32-i is determined. A calculation module of the control unit calculates the ratio 63-1, 63-2 to 63-i of the initial value 61-1, 61-2 to 61-i to the time value 62-1, 62-2 to 62-i of the SOC for each module. In a further step, the ratio 63-1, 63-2 to 63-i of the initial value 61-1, 61-2 to 61-i to the time value 62-1, 62-2 to 62-i of the SOC is compared with a threshold value and a comparison result 64-1, 64-2 to 64-i is produced. In a further step, a decision 65-1, 65-2 to 65-i is made for each of the individual battery modules 32-1, 32-2 to 32-i regarding whether or not it is disconnected. In this case, the control system will switch off those battery modules 32-1, 32-2 to 32-i which deviate the most from the threshold value of the SOC. In the example illustrated, it may be that the first battery module 63-1 is reused since the ratio 63-1 is greater than the threshold value, whereas the second battery module 63-2 is disconnected since the ratio 63-2 is lower than the threshold value. After a specific number of travel cycles, the control system will set a different value for the threshold value, as a result of which the previously weaker battery modules can be used at a later point in time. The weaker battery modules can therefore be reused at a later point in time with other stronger battery modules, i.e. reconnected.

Figure 8:
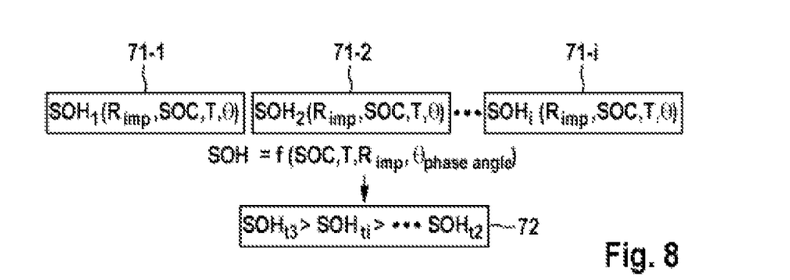
FIG. 8 shows a schematic illustration of a third embodiment of the battery module balancing according to the disclosure.

FIG. 8 shows a further embodiment of the method according to the disclosure for battery module balancing, wherein initially the SOH values 71-1, 71-2 to 71-i of the battery modules 32-1, 32-2 to 32-i are determined. The index i in turn denotes the number of battery modules in the battery. For the calculation of the SOH, various known possibilities are available. The SOH can be a function of the SOC, the temperature, the real component of the complex impedance $R_{imp}$ and/or the angle or phase information of the complex impedance. In a further step, the SOH values at a fixed time t are arranged in order of size in a data field 72 provided for this purpose. In the example illustrated, it is established that the battery module 32-2 has the lowest value of the SOH, whereupon it is switched off.

Figure 9:
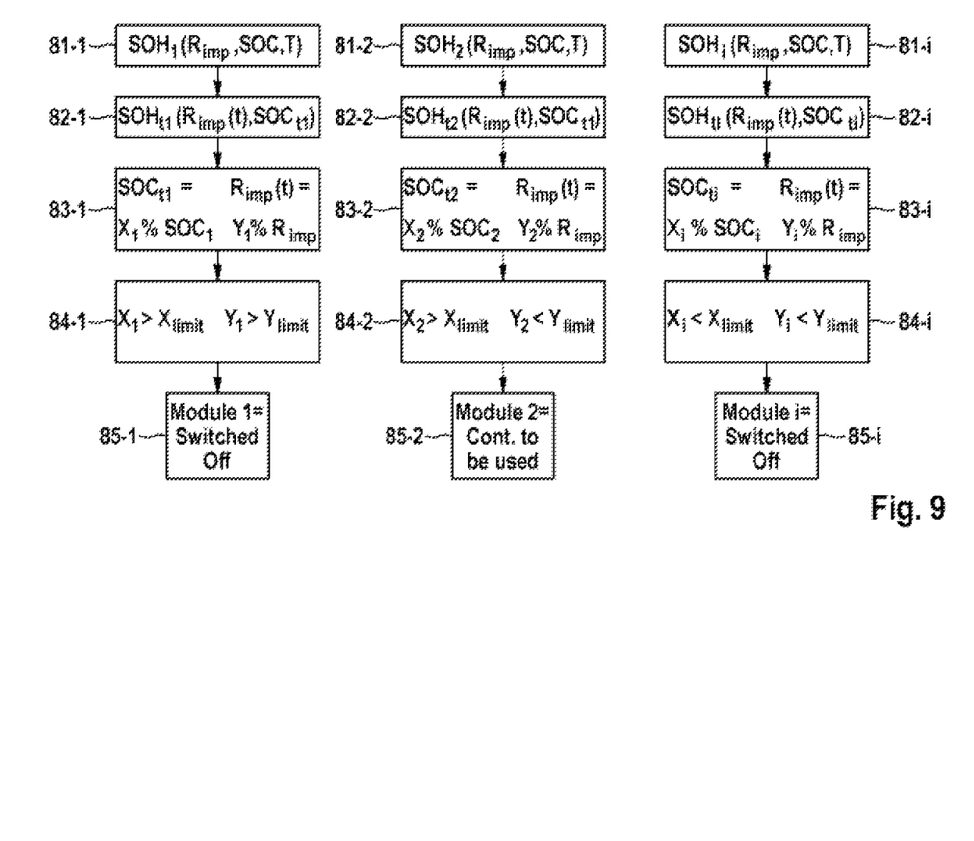
FIG. 9 shows a schematic illustration of a fourth embodiment of the method according to the disclosure for battery module balancing.

FIG. 9 shows a further possibility for the implementation of the method according to the disclosure, in which, in a first step, the initial value 81-1, 81-2 to 81-$i$ of the SOH values of the battery modules 32-1, 32-2 to 32-$i$ is determined, at a time t the time value 82-1, 82-2 to 82-$i$ of the SOH values of the battery modules 32-1, 32-2 to 32-$i$ is determined and a ratio 83-1, 83-2 to 83-$i$ of the initial values 81-1, 81-2 to 81-$i$ to the time values 82-1, 82-2 to 82-$i$ of the SOH is determined for each battery module 32-1, 32-2 to 32-$i$, where i is in turn the number of battery modules in the battery. In a further step, the ratios 83-1, 83-2 to 83-$i$ of the initial values to the time values of the SOH are compared with threshold values and a comparison result 84-1, 84-2 to 84-$i$ is set. In a further step, a decision 85-1, 85-2 to 85-$i$ is taken for each of the individual battery modules 32-1, 32-2 to 32-$i$ in respect of whether or not it is disconnected. The control system will in this case switch off those battery modules 32-1, 32-2 to 32-$i$ which deviate the most from the threshold value of the SOH. If, for example, the measured SOH of a specific battery module is such that the ratio of the SOC value is much higher than a threshold value of the SOC value, but the battery module has a higher impedance, the control system will disconnect the battery module which has a higher impedance or a higher internal impedance. After a specific number of travel cycles and/or after a specific time, the limit values of the SOH, for example the SOC and the impedance, are reduced, as a result of which battery modules which were initially weaker can be used again.

The disclosure is not restricted to the exemplary embodiments described here and the aspects highlighted therein. Rather, a multiplicity of developments which are within the scope of practice of a person skilled in the art is possible.

The invention claimed is:

1. A method for battery module balancing of a battery having a battery module string, the battery module string comprising a plurality of battery modules connected in series, each battery module comprising at least one battery cell and a coupling unit configured to connect the respective battery module into the battery module string and disconnect the respective battery module from the battery module string, the method comprising:
   determining a battery module state of each battery module in the plurality of battery modules;
   disconnecting a defined number of battery modules in the plurality of battery modules having lowest battery module states from the battery module string, the defined number being dependent on a required output voltage for the battery module string, the lowest battery module states being defined by determining a ratios of each determined battery module state with respect to a corresponding initial battery module state and comparing the ratios with a threshold value, the lowest battery module states being defined based on which of the ratios are below the threshold value, the threshold value being changed at least one of after a specific amount of time and after a specific number of charging cycles and discharging cycles; and
   providing the required output voltage with the battery module string while the defined number of battery modules are disconnected from the battery module string.

2. The method as claimed in claim 1, wherein the determined battery module state is a state of charge.

3. The method as claimed in claim 1, wherein the determined battery module state is a state of health, the state of health being a function of at least two parameters selected from the following list: resistance, capacitance, state of charge, time, charging cycles and discharging cycles, and temperature.

4. The method as claimed in claim 1, further comprising:
   determining the required output voltage for the battery module string based on an accelerator pedal position.

* * * * *

UNITED STATES PATENT AND TRADEMARK OFFICE
CERTIFICATE OF CORRECTION

PATENT NO. : 10,084,323 B2
APPLICATION NO. : 14/650320
DATED : September 25, 2018
INVENTOR(S) : Fetzer et al.

It is certified that error appears in the above-identified patent and that said Letters Patent is hereby corrected as shown below:

In the Claims

In Column 8, Lines 11-13, of Claim 1 should read:
voltage for the battery module string, the lowest battery
module states being defined by determining ratios of
each determined battery module state with respect to a Signed and Sealed this
Ninth Day of April, 2019

Andrei Iancu
*Director of the United States Patent and Trademark Office*